United States Patent
Morozumi et al.

[11] Patent Number: 5,986,523
[45] Date of Patent: Nov. 16, 1999

[54] EDGE REFLECTION TYPE LONGITUDINALLY COUPLED SURFACE ACOUSTIC WAVE FILTER

[75] Inventors: Kazuhiko Morozumi, Ishikawa-ken; Haruo Morii, Kanazawa; Michio Kadota, Kyoto, all of Japan

[73] Assignee: Murata Manufacturing Co., Ltd., Japan

[21] Appl. No.: 09/131,539

[22] Filed: Aug. 10, 1998

[30] Foreign Application Priority Data

Aug. 29, 1997 [JP] Japan ................................ 9-233940

[51] Int. Cl.⁶ ........................................ H03H 9/64
[52] U.S. Cl. ........................ 333/194; 333/196; 310/313 B
[58] Field of Search ..................... 333/193–196; 310/313 R, 313 B, 313 C, 313 D, 313 A

[56] References Cited

U.S. PATENT DOCUMENTS

| | | | |
|---|---|---|---|
| 4,204,178 | 5/1980 | Mitchell | 333/194 |
| 5,184,042 | 2/1993 | Kadota et al | 333/193 X |
| 5,781,083 | 7/1998 | Horiuchi et al. | 333/193 X |
| 5,793,147 | 8/1998 | Kadota et al. | 310/313 R |
| 5,838,217 | 11/1998 | Kadota et al. | 333/193 |

FOREIGN PATENT DOCUMENTS

| | | | |
|---|---|---|---|
| 56-141613 | 11/1981 | Japan | 333/196 |
| 61-100014 | 5/1986 | Japan | 333/194 |
| 4-87410 | 3/1992 | Japan | 333/194 |
| 4-86114 | 3/1993 | Japan | 333/194 |
| 5-145368 | 6/1993 | Japan | 333/193 |
| 5-291869 | 11/1993 | Japan | 333/194 |

*Primary Examiner*—Robert Pascal
*Assistant Examiner*—Barbara Summons
*Attorney, Agent, or Firm*—Graham & James LLP

[57] ABSTRACT

An edge reflection longitudinally coupled surface acoustic wave filter utilizing an SH-type surface wave includes a piezoelectric substrate having two opposing edge surfaces, and first and second interdigital transducers each having a plurality of electrode fingers and being arranged on the piezoelectric substrate such that a shear horizontal surface wave excited by one of the first and second interdigital transducers is reflected between the two opposing edge surfaces to form a standing wave. Attenuation poles of frequency characteristics of the first and second interdigital transducers are adjacent to the frequency position of spurious responses determined by the distance between the two opposing edge surfaces.

18 Claims, 7 Drawing Sheets

FREQUENCY (MHz)

EDGE REFLECTION TYPE LONGITUDINALLY COUPLED SURFACE ACOUSTIC WAVE FILTER

BACKGROUND OF THE INVENTION

1. Field of the Invention

The present invention relates to a surface acoustic wave filter utilizing a shear horizontal (hereinafter abbreviated as SH) type surface wave, and more particularly, to a longitudinally coupled surface acoustic wave (hereinafter abbreviated as SAW) filter.

2. Description of the Related Art

A longitudinally coupled double-mode SAW filter utilizing a surface wave has been known as one type of various SAW devices. An example of this type of longitudinally coupled SAW filter is shown in FIG. 1.

A SAW filter 51 has a construction in which first and second interdigital transducers (hereinafter abbreviated as IDTs) 53 and 54 are disposed on a rectangular piezoelectric substrate 52. Reflectors 55 and 56 are disposed on both sides of the IDTs 53 and 54 along the propagation direction of a surface wave excited by the IDTs 53 and 54.

In the SAW filter 51, one of the comb-shaped electrodes 53a of the IDT 53 is an input end, and one of the comb-shaped electrodes 54a of the other IDT 54 is an output end. The other comb-shaped electrodes 53b and 54b of the IDTs 53 and 54 are connected to the ground potential.

When an input voltage is applied to the IDT 53, a surface wave is excited and propagates in a direction which is perpendicular to the direction in which an electrode finger of the IDT 53 extends. The surface acoustic wave is then reflected between the reflectors 55 and 56, and becomes a standing wave. An output based on such a standing wave is extracted by the IDT 54. In this case, as a surface wave, a fundamental mode and a high-order mode (asymmetrical mode) are generated. Therefore, the SAW filter 51 operates as a longitudinally coupled double-mode SAW filter.

The conventional longitudinally coupled SAW filter 51 has the problem that the overall dimensions of the filter are excessively large because of the presence of the reflectors 55 and 56. Also, in the SAW filter 51, since an electromechanical coupling coefficient of a piezoelectric substrate 2 is not very large, only a narrow band filter can be achieved.

An edge reflection type longitudinally coupled surface acoustic wave filter utilizing an SH-type surface wave shown in FIG. 2 is disclosed in Japanese Laid-Open Patent Publication No. 9-69751. This filter can allegedly solve the above problems experienced by the filter shown in FIG. 1.

The SAW filter 61 shown in FIG. 2 includes a rectangular piezoelectric substrate 62. The piezoelectric substrate 62 has two opposing edge surfaces 62a and 62b. First and second IDTs 63 and 64 are disposed on the top surface 62c of the piezoelectric substrate 62. The IDTs 63 and 64 have a pair of comb-shaped electrodes 63a and 63b, and 64a and 64b, respectively, and the numbers of pairs of electrode fingers are almost the same.

In order that an SH-type surface wave, such as a BGS (Bleustein-Gulyaev-Shimizu) wave, is excited and reflected between the two opposing edge surfaces 62a and 62b, one of a pair of outermost electrode fingers of the comb-shaped electrode 63a is arranged so as to be flush with the edge surface 62a of the piezoelectric substrate 62. In a similar manner, one of a pair of outermost electrode fingers of the comb-shaped electrode 64b is arranged so as to be flush with the edge surface 62b of the piezoelectric substrate 62. One of the comb-shaped electrodes 63a of the first IDT 63 is an input end, and one of the comb-shaped electrodes 64a of the IDT 64 is an output end, and the comb-shaped electrodes 63b and 64b are connected to a ground potential.

When an input voltage is applied to the IDT 63, a surface wave is excited and propagates in a direction that is perpendicular to the direction in which the electrode fingers of the IDT 63 extends. That is, the surface wave propagates in a direction which connects the two opposing edge surfaces 62a and 62b. This surface wave is reflected by the edge surfaces 62a and 62b, and becomes a standing wave. An output based on this standing wave is extracted from the IDT 64.

Therefore, in the edge reflection-type SAW filter 61 utilizing an SH-type surface wave, since a reflector is not required, a longitudinally coupled double-mode SAW filter has a greatly reduced overall size and a loss caused by the presence of a reflector does not occur. Thus, a surface acoustic wave filter having wider band characteristics can be achieved with this structure.

However, in the SAW filter 61, there is a problem in that spurious responses which are dependent upon the distance between the two opposing edge surfaces 62a and 62b appear over the outside of the passband in the filter characteristics, and, in particular, relatively large spurious responses appear in a frequency region in the vicinity of a passband and outside the passband. This problem is specific to an edge reflection-type SAW filter. The SAW filter 51 shown in FIG. 1 having the reflectors 55 and 56 does not usually suffer from such a problem since the spurious response can be suppressed by adjusting the material, thickness, width of the electrode fingers and number of the electrode fingers of the IDTs and reflectors or selecting an appropriate substrate.

SUMMARY OF THE INVENTION

To overcome the problems described above, the preferred embodiments of the present invention provide an edge reflection-type SAW filter utilizing an SH-type surface wave, which effectively suppresses spurious responses dependent upon the distance between two opposing edge surfaces and achieves excellent filter characteristics while having a greatly reduced size.

According to a preferred embodiment of the present invention, a surface acoustic wave filter includes a piezoelectric substrate having two opposing edge surfaces, and first and second interdigital transducers each having a plurality of electrode fingers and being disposed on the piezoelectric substrate such that a shear horizontal surface wave excited by one of the first and second interdigital transducers is reflected between the two opposing edge surfaces to form a standing wave. Attenuation poles of frequency characteristics of the first and second interdigital transducers are adjacent to the frequency position of spurious responses determined by the distance between the two opposing edge surfaces.

A ratio of numbers of pairs of electrode fingers of the first and second interdigital transducers is preferably in a range of about 1.2:1.0 to about 1.7:1.0. A plurality of at least one of the first and second IDTs may be provided in the filter according to this preferred embodiment.

In the surface acoustic wave filter in accordance with preferred embodiments of the present invention, preferably, the IDTs may be connected at a plurality of stages, and in that case, one of the first and second IDTs having a larger number of pairs of electrode fingers is an input side or an output side, and the other of the first and second IDTs having a relatively smaller number of pairs of electrode fingers is used for interstage connection.

According to preferred embodiments of the present invention, since the attenuation pole of frequency characteristics of the first or second IDT is adjacent to a position at which spurious responses determined by the distance between two opposing edge surfaces appear, it is possible to effectively suppress the spurious level determined by the distance between the two opposing edge surfaces, and thereby, excellent filter characteristics are obtained. Also, since the SAW filter in accordance with preferred embodiments of the present invention is an edge surface reflection-type SAW filter utilizing an SH-type surface wave, a reflector is not required. Therefore, it is possible to provide a band filter having a greatly reduced size and excellent filter characteristics.

According to another preferred embodiment of the present invention, since the ratio of the numbers of pairs of electrode fingers of the first and second IDTs is in a range of about 1.2:1 to about 1.7:1, the attenuation pole of frequency characteristics of the first and second IDTs is adjacent to the position of the spurious responses determined by the distance between two opposing edge surfaces. As a result, it is possible to effectively suppress the spurious responses determined by the distance between two opposing edge surfaces.

For the purpose of illustrating the present invention, there is shown in the drawings several forms which are presently preferred, it being understood, however, that the invention is not limited to the precise arrangements and instrumentalities shown.

DETAILED DESCRIPTION OF PREFERRED EMBODIMENTS

Hereinafter, the preferred embodiments of the present invention are explained in detail with reference to the drawings.

Figure 3:
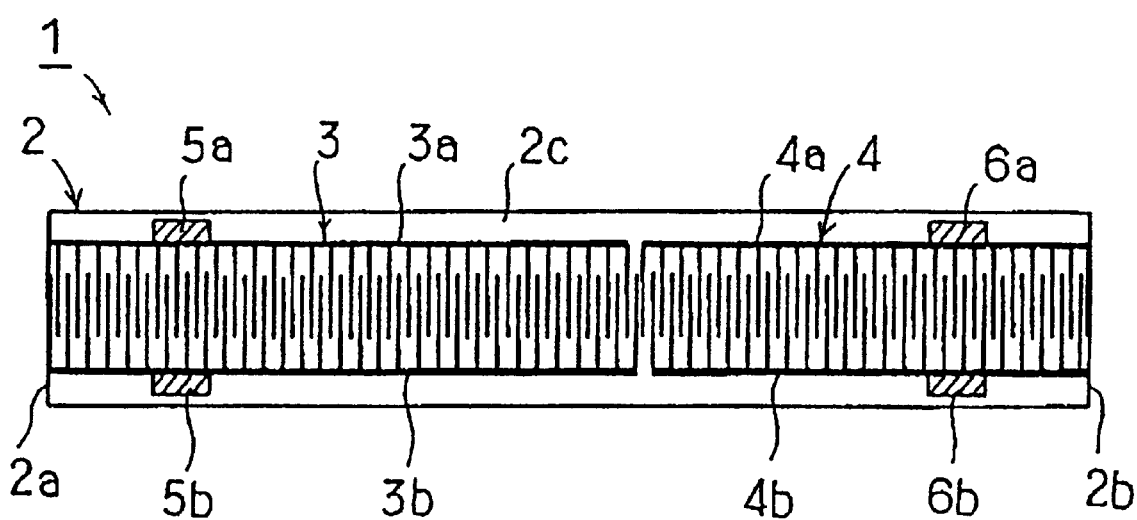
FIG. 3 is a plan view showing a SAW filter according to a first preferred embodiment of the present invention.

FIG. 3 is a plan view showing a longitudinally coupled double-mode SAW filter utilizing a BGS wave according to a first preferred embodiment of the present invention. A SAW filter 1 includes a piezoelectric substrate 2. The piezoelectric substrate 2 can be formed from $LiNbO_3$, $LiTaO_3$, a piezoelectric single crystal such as quartz crystal, or a piezoelectric ceramic such as lead zirconate titanate. In this preferred embodiment, the piezoelectric substrate 2 is preferably formed from lead zirconate titanate (PZT).

The piezoelectric substrate 2 has two opposing edge surfaces 2a and 2b. The edge surfaces 2a and 2b are arranged to be substantially parallel to each other.

A first IDT 3 and a second IDT 4 are disposed on the top surface 2c of the piezoelectric substrate 2. The IDT 3 has a construction in which comb-shaped electrodes 3a and 3b are arranged such that electrode fingers of the comb-shaped electrodes 3a and 3b are interdigitated with each other. In a similar manner, the IDT 4 has a construction in which comb-shaped electrodes 4a and 4b are arranged such that electrode fingers of the comb-shaped electrodes 4a and 4b are interdigitated with each other. The electrode fingers of the IDTs 3 and 4 are preferably arranged to extend substantially parallel to the edge surfaces 2a and 2b.

One of a pair of outermost electrode fingers of the IDT 3 is formed so as to be flush with the edge surface 2a. In a similar manner, one of a pair of outermost electrode fingers of the IDT 4 is formed so as to be flush with the edge surface 2b.

An input electrode 5a is provided in the comb-shaped electrode 3a so as to be connected thereto, and a grounding electrode 5b is provided in the comb-shaped electrode 3b so as to be connected thereto. In a similar manner, on the IDT 4 side, an output electrode 6a is provided in a comb-shaped electrode 4a so as to be connected thereto, and a grounding electrode 6b is provided in a comb-shaped electrode 4b so as to be connected thereto.

The IDTs 3 and 4, and the electrodes 5a, 5b, 6a and 6b are preferably formed from a metallic material, such as aluminum. The formation of these electrodes can be performed by a well-known method, such as photolithographic technology and a thin-film deposition technique.

The SAW filter 1 of this preferred embodiment is preferably constructed such that a ratio of the numbers of pairs of electrode fingers of the first IDT 3 to that of the second IDT 4 is set within the range of about 1.2:1 to about 1.7:1. Note that, in this specification, a number of pairs of electrode fingers of an IDT is calculated based on two adjacent electrode fingers having one space therebetween being a half (0.5) pair. Thus, two electrode fingers which belong to one of a pair of comb-shaped electrodes and one electrode finger which belongs to the other of the pair of comb-electrodes and is interposed between the two electrode fingers are regarded as one pair. In the preferred embodiment shown in FIG. 3, the number of pairs of electrode fingers of the IDT 3 is 30, and the number of pairs of electrode fingers of the IDT 4 is 23. Thus, the ratio of the numbers of pairs of electrode fingers of the first IDT 3 to that of the second IDT 4 is set at about 1.3:1. As a result, spurious responses determined by the distance between the two opposing edge surfaces 2a and 2b can be suppressed, and satisfactory filter characteristics can be obtained. This will now be described with reference to specific experimental examples of preferred embodiments of the present invention.

The SAW filter 1 is prepared such that the IDT 3 having 30 pairs of electrode fingers and the IDT 4 having 23 pairs of electrode fingers are disposed on the piezoelectric substrate 2, preferably formed of PZT, having a distance between the two opposing edge surfaces 2a and 2b which is about 2.75 mm, with the width of the electrode fingers being about 12.94 μm and the pitch of the electrode fingers being about 25.88 μm. The filter characteristics of the SAW filter 1 are shown by the solid line in FIG. 4. The broken line in FIG. 4 is such that the scale of the vertical axis of the characteristics of the solid line is enlarged 10 times, and the scale of the horizontal axis thereof is enlarged 5 times.

Figure 1:
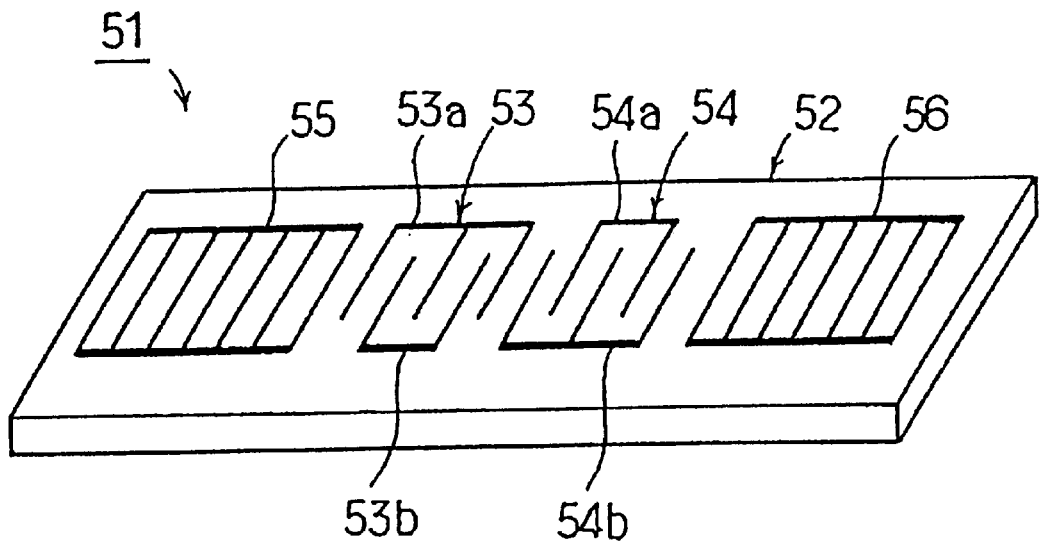
FIG. 1 is a perspective view showing an example of a conventional longitudinally coupled SAW filter.
Figure 2:
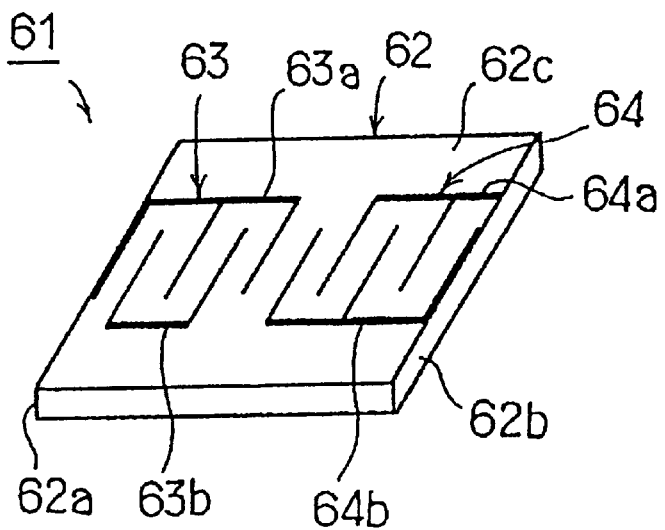
FIG. 2 is a perspective view showing a conventional longitudinally coupled SAW filter of an edge surface reflection-type.

For a comparison, the SAW filter 61 shown in FIG. 2 is manufactured to the same specifications as that described above with reference to the example of preferred embodiments of the present invention except for the numbers of pairs of IDTs. In the SAW filter 61, the number of pairs of electrode fingers of the IDT 63 is 26.5, and the number of pairs of electrode fingers of the IDT 64 is 26.5, so that the ratio of the numbers of pairs of electrode fingers of the IDTs 63 and 64 is 1:1. The filter characteristics of this SAW filter 61 are shown by the solid line in FIG. 5. The broken line in FIG. 5 is such that the scale of the vertical axis of the characteristics of the solid line is enlarged 10 times, and the scale of the horizontal axis thereof is enlarged 5 times.

Figure 4:
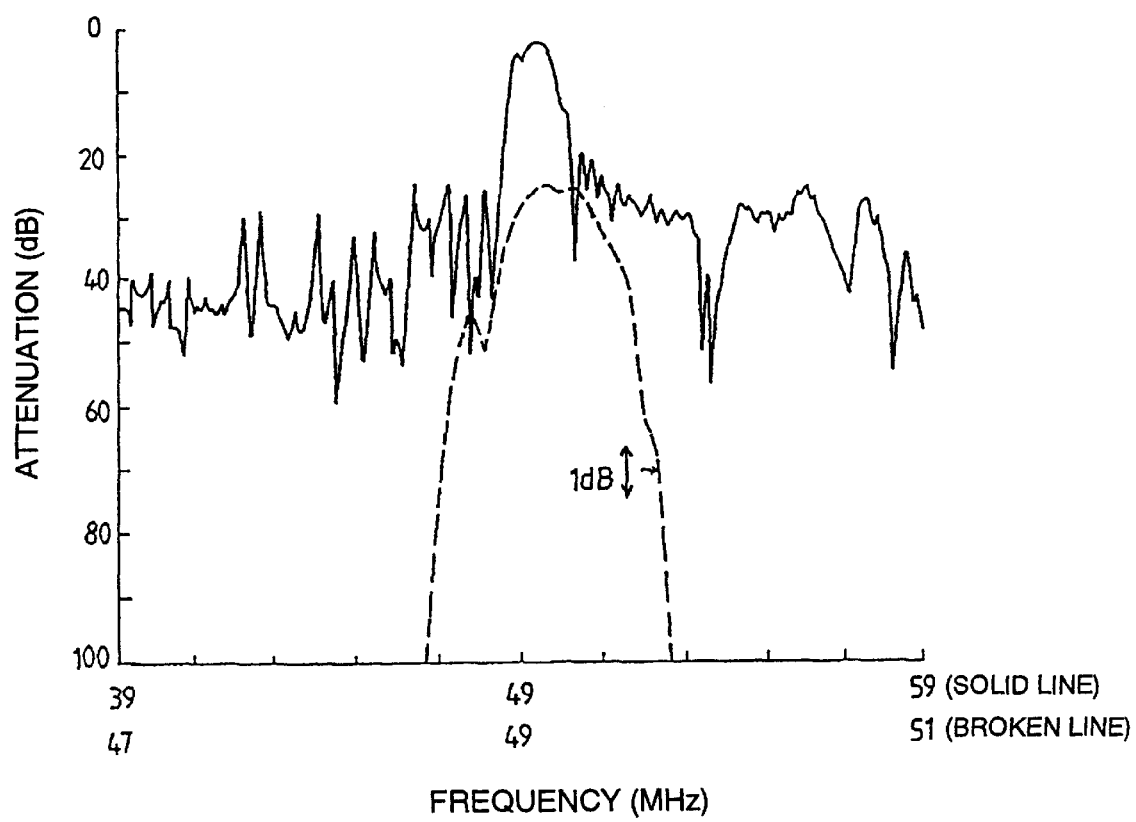
FIG. 4 is a view showing the filter characteristics of the SAW filter of the first preferred embodiment.
Figure 5:
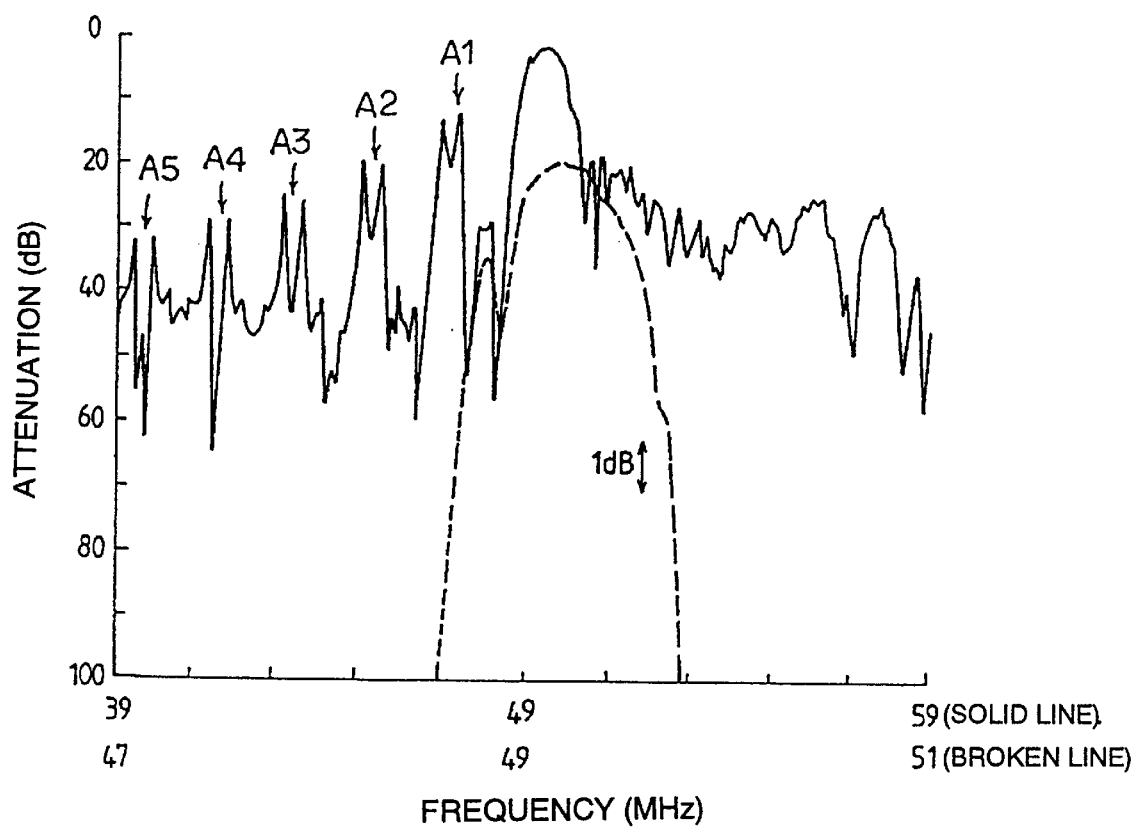
FIG. 5 is a view showing the filter characteristics of the longitudinally coupled SAW filter shown in FIG. 2.

As is clear from a comparison between the characteristics shown in FIGS. 4 and 5, relatively large spurious responses indicated by the arrows A1 to A5 appear outside the passband in the filter characteristics shown in FIG. 5, in particular, in frequencies lower than the passband. In comparison with this, in the filter characteristics shown in FIG. 4, it can be seen that the spurious level at the position corresponding to the above-described spurious responses is considerably small. That is, while the level (hereinafter referred to as a spurious level) of the largest spurious response A1 in FIG. 5 of the above-described spurious responses is about 12.1 dB, in the characteristics of the SAW filter 1 of this preferred embodiment shown in FIG. 4, the spurious peak level is about 24.6 dB. It can be seen that the spurious peak level can be suppressed by about 14.5 dB compared to the SAW filter 61.

As described above, the fact that the spurious responses are effectively suppressed in the SAW filter 1 of this preferred embodiment is considered to be attributed to the following reason.

In the longitudinally coupled SAW filter of an edge reflection type filter, the distance R between two opposing edge surfaces can be expressed by the following when the wavelength of the SH-type surface wave is denoted as $\lambda$, and the numbers of pairs of electrode fingers of the first and second IDTs are denoted as $N_1$ and $N_2$, respectively, and the distance between the IDTs is denoted as $\gamma$, $$R = \lambda \times (N_1 + N_2) + \gamma$$

Figure 6:
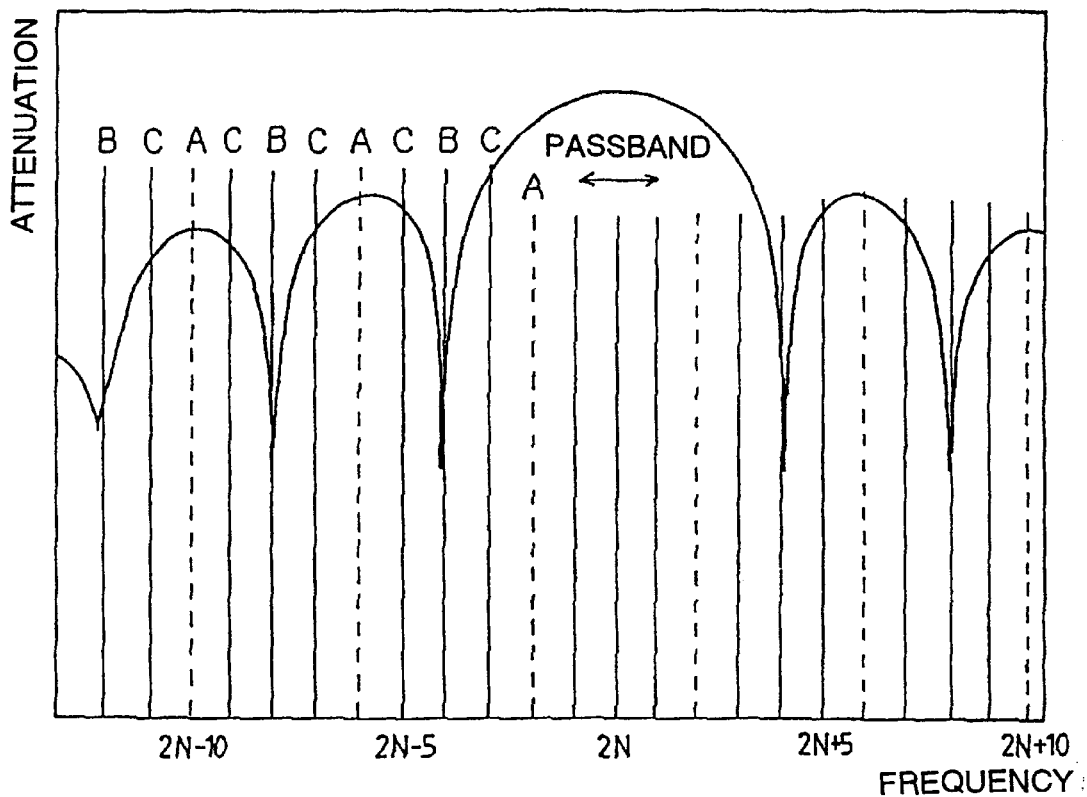
FIG. 6 is a view illustrating the relationship between the frequency characteristics of an IDT in a conventional longitudinally coupled SAW filter of an edge surface reflection-type, and the position at which spurious responses determined by the distance between edge surfaces appear.

Therefore, it can be seen that the spurious response dependent upon the distance R between two opposing edge surfaces depends upon $(N_1+N_2)$. As a result, in the conventional SAW filter 61, when a main response used for the filter characteristics is of a 2Nth order, as shown in FIG. 6, a response of $2N \pm (4n-2)$th order (n=1, 2, ...) indicated by the broken line A does not occur due to the symmetry of the polarities of the electrodes, but spurious responses are generated at an order other than that. Of the spurious responses, the spurious responses corresponding to an attenuation pole of the frequency spectrum indicated by the solid line B or a point of the larger attenuation of the spectrum are suppressed. However, the response of $2N \pm (2n+1)$th order (n=1, 2, ...) determined by the distance R between the two opposing edge surfaces indicated by the solid line C is generated where the attenuation of the IDT spectrum is small. As a result, this response appears as a spurious response of the filter characteristics.

Figure 7:
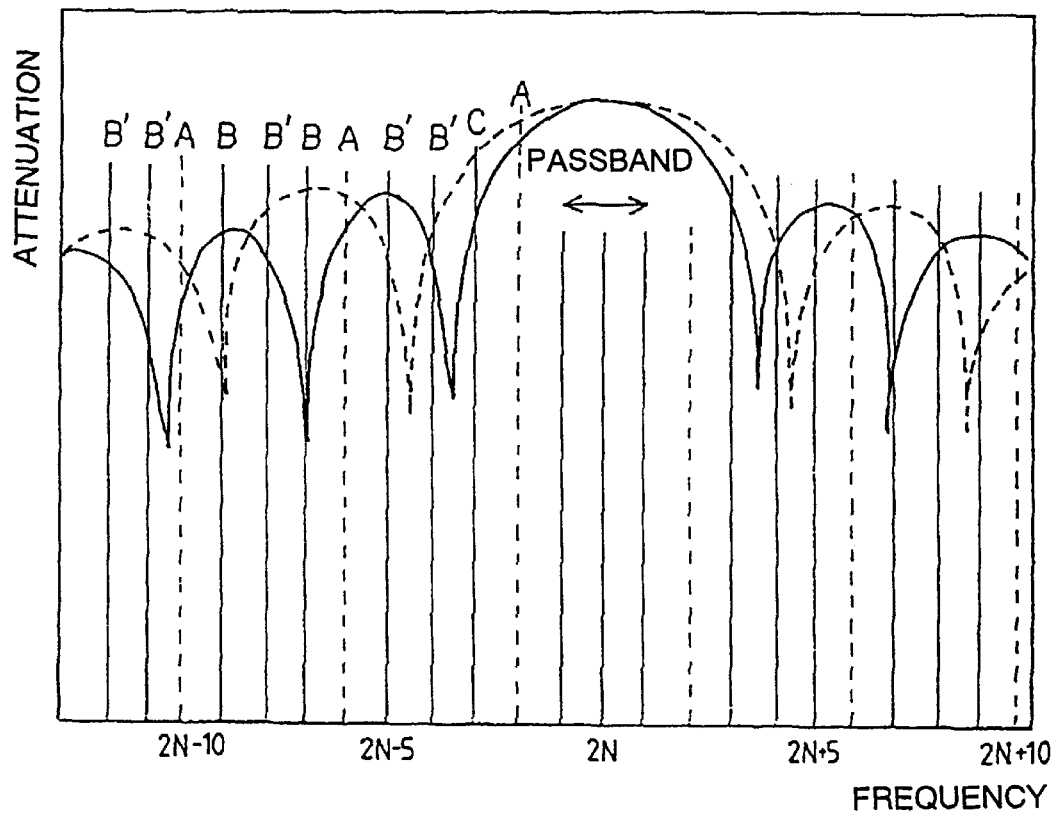
FIG. 7 is a view illustrating the relationship between the frequency characteristics of first and second IDTs in the SAW filter of the first preferred embodiment, and the position at which spurious responses determined by the distance between edge surfaces appear.

In contrast, in the SAW filter 1 of this preferred embodiment, as shown in FIG. 7, the spurious responses determined by the distance between edge surfaces correspond to the attenuation poles as indicated by the solid lines B, or correspond to the points with a larger attenuation as indicated by the solid lines B'. Therefore, only a very small spurious response appears in the filter characteristics.

As is clear from FIG. 7, in this preferred embodiment, the attenuation poles in the frequency characteristics of the IDT 3 or the IDT 4 are located in the vicinity of the position where the spurious responses determined by the distance R between edge surfaces appear. Therefore, it is possible to suppress the level of the spurious responses determined by the distance R between edge surfaces.

In the manner described above, in order that the attenuation poles of the IDT 3 or the IDT 4 are arranged adjacent to the position at which the spurious responses determined by the distance R between edge surfaces appear, as shown by the differences between the solid line and the dashed line in FIG. 7, the frequency characteristics of the IDT 3 on the input side are deviated from the frequency characteristics of the IDT 4 on the output side. In this preferred embodiment, this is achieved by setting the ratio of the numbers of pairs of electrode fingers of the IDT 3 to that of the IDT 4 at 1.3:1.

In other words, in the construction including the first and second IDTs 3 and 4, if the numbers of pairs of electrode fingers of the first and second IDTs 3 and 4 are made different, and if the respective frequency characteristics are made different, it is possible to deviate the attenuation pole which appears in the frequency characteristics of the first and second IDTs 3 and 4. Therefore, by setting the numbers of pairs of electrode fingers of the first and second IDTs 3 and 4 so that these attenuation poles are made adjacent to the position at which the spurious responses determined by the distance R between edge surfaces appear and preferably matched to the position, the spurious responses determined by the distance R between edge surfaces can be suppressed effectively.

Figure 8:
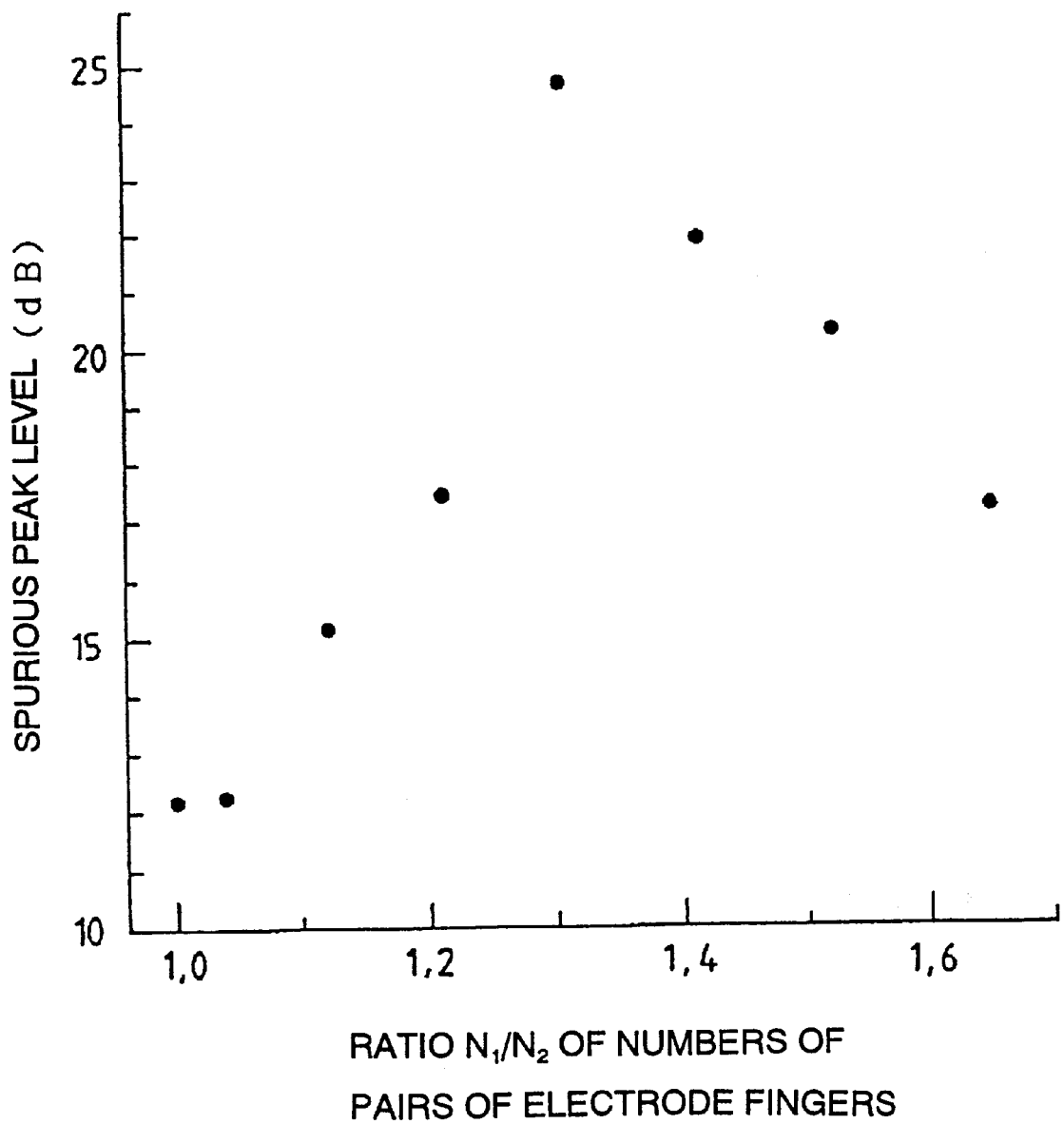
FIG. 8 is a view showing the relationship between the ratio of the numbers of pairs of electrode fingers of the first and second IDTs and a spurious peak level in the SAW filter of the first preferred embodiment.

Based on the above-described results, the ratio $N_1/N_2$ of the numbers of pairs of electrode fingers of the first and second IDTs 3 and 4 were made different in various ways, and to what degree the spurious level outside the passband is suppressed was measured. The results are shown in FIG. 8. The horizontal axis indicates the ratio $N_1/N_2$ of the numbers of pairs of electrode fingers of the first and second IDTs 3 and 4 and the vertical axis indicates the spurious peak level of the spurious level outside the passband.

As is clear from FIG. 8, if the ratio of the numbers of pairs of electrode fingers of the first and second IDTs 3 and 4 is set at about 1.2:1 to about 1.7:1, it can be seen that the spurious peak level can be suppressed by 10 dB or more compared to the case where the numbers of pairs of electrode fingers of the first and second IDTs are equal. Therefore, in the SAW filter 1, by setting the ratio of the numbers of pairs of electrode fingers of the first and second IDTs 3 and 4 at about 1.2:1 to about 1.7:1 as described above, it can be seen that it is possible to effectively suppress spurious responses outside the passband, in particular, the spurious responses determined by the distance R between edge surfaces, which appear in frequencies lower than the passband.

Note that, in the SAW filter 1, one of the first IDT 3 and the second IDT 4 is an IDT on the input side, and the other of the first and second IDTs 3, 4 is an IDT on the output side.

However, any of the IDTs 3 and 4 may be the input side and the output side. Furthermore, it was confirmed by the inventors of the present invention that, when the SAW filter 1 is connected to another SAW filter so as to form a plural-stage construction, satisfactory filter characteristics are obtained by arranging the IDT 3 side having a larger number of pairs of electrode fingers to be an input-side or output-side IDT and by using the second IDT 4 with a smaller number of pairs of electrode fingers for interstage connection. This is considered to be attributed to the fact that impedance matching becomes satisfactory.

Figure 9:
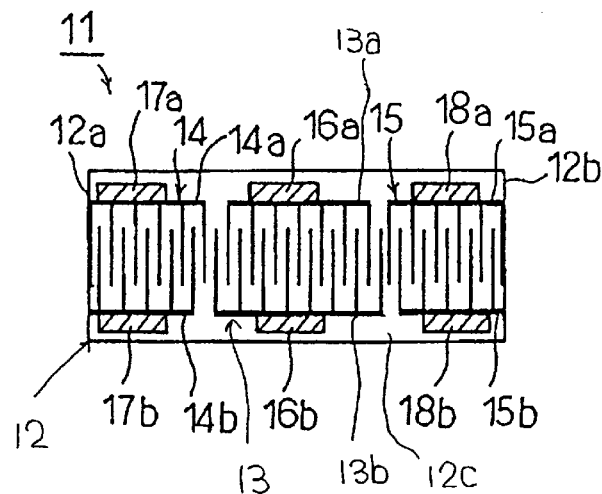
FIG. 9 is a plan view showing a SAW filter according to a second preferred embodiment of the present invention.

The SAW filter in accordance with preferred embodiments of the present invention is not limited to a filter, such as the SAW filter 1, which includes one first IDT 3 and one second IDT 4, and a plurality of at least one of the first and second IDTs 3 and 4 may be disposed. FIG. 9 is a plan view showing a preferred embodiment in which one first IDT and two second IDTs are provided.

In a SAW filter 11 shown in FIG. 9, a first IDT 13 is disposed on a top surface 12c of a piezoelectric substrate 12 which is constructed similarly to the piezoelectric substrate 2. Second IDTs 14 and 15 are disposed on both sides of the IDT 13.

The IDT 13 includes comb-shaped electrodes 13a and 13b arranged such that respective electrode fingers are interdigitated with each other. An input electrode 16a is arranged to be connected to the comb-shaped electrode 13a, and a grounding electrode 16b is arranged to be connected to the comb-shaped electrode 13b. The IDTs 14 and 15 include comb-shaped electrodes 14a and 14b, and 15a and 15b, respectively. Output electrodes 17a and 18a are arranged to be connected to the comb-shaped electrodes 14a and 15a, respectively. Also, grounding electrodes 17b and 18b are arranged to be connected to the comb-shaped shaped electrodes 17b and 18b, respectively.

One of a pair of outermost electrode fingers of the IDT 14 is arranged so as to be flush with the edge surface 12a. In the same way, one of a pair of outermost electrode fingers of the IDT 15 is arranged so as to be flush with the edge surface 12b.

The SAW filter 11 is constructed so as to operate as a longitudinally coupled double-mode SAW filter of an edge surface reflection-type utilizing a BGS wave.

In the SAW filter 11 of this preferred embodiment, a number $N_1$ of pairs of electrode fingers of the first IDT 13 is preferably set at 7, and a number $N_2$ of pairs of electrode fingers of each of the second IDTs 14 and 15, which are IDTs on the output side, is preferably set at 5. That is, the ratio of the numbers of pairs of electrode fingers of the first and second IDTs is set at about 7:5 which is equal to about 1.4:1.

Figure 10:
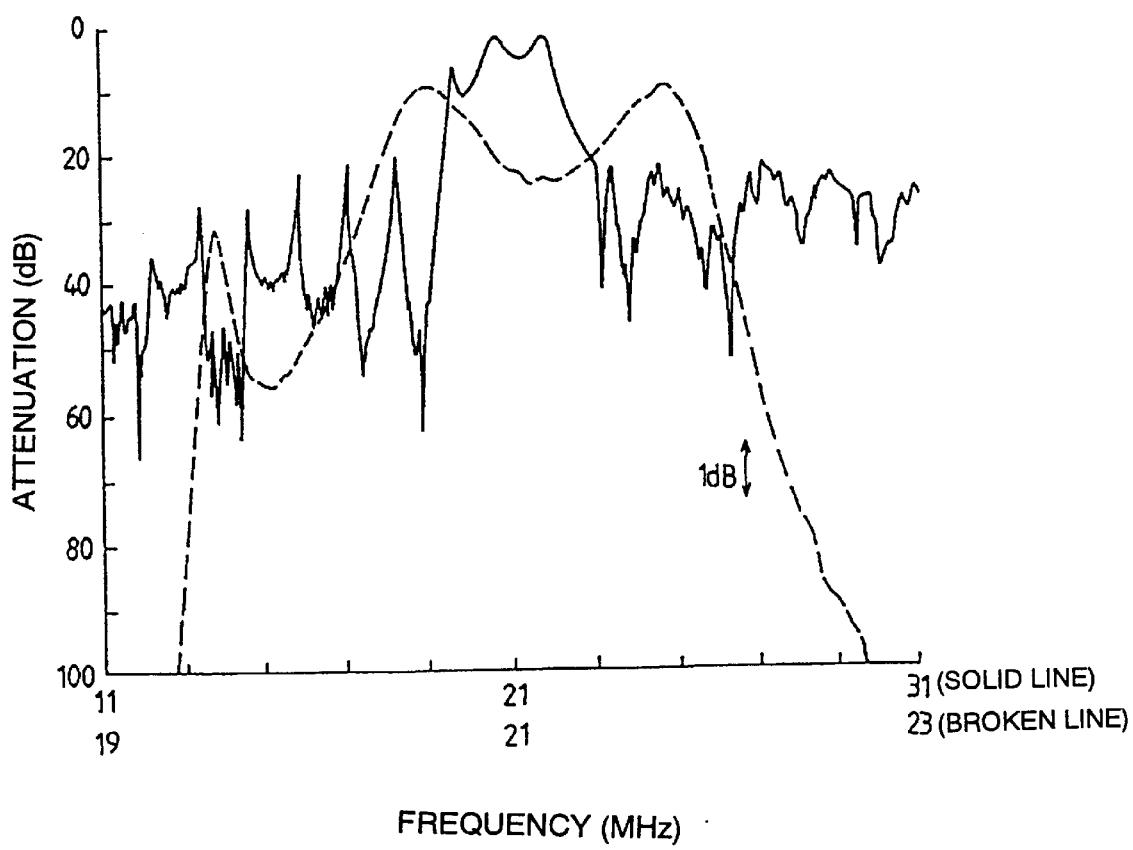
FIG. 10 is a view showing filter characteristics of the SAW filter shown in FIG. 9.

The filter characteristics of the SAW filter 11 are shown by the solid line in FIG. 10. The broken line in FIG. 10 is such that the scale of the vertical axis of the characteristics of the solid line is enlarged 10 times, and the scale of the horizontal axis thereof is enlarged 5 times.

As indicated by the solid line in FIG. 10, also in the SAW filter 11, it can be seen that spurious responses in the frequencies lower than the passband are suppressed, and the spurious peak level is set at about 18 dB. Although not particularly shown in FIG. 10, in the SAW filter 11, when the number of pairs of electrode fingers of IDTs 15 and 14 was set at 7, which is equal to that of the IDT 13, the spurious peak level was 10 dB. Therefore, in the SAW filter 11, by setting the ratio of the numbers of pairs of electrode fingers at about 1.4:1 as described above, it can be seen that the spurious peak level can be suppressed by 8 dB compared to a SAW filter corresponding to a filter such that the numbers of pairs of electrode fingers of all three IDTs are equal.

Although in the SAW filters 1 and 11 of the above-described preferred embodiments, a filter utilizing a BGS wave as an SH-type surface wave is described, in addition to the BGS wave, other SH-type surface waves, such as a Love wave or a leakage surface acoustic wave, may be used.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An edge reflection type longitudinally coupled surface acoustic wave filter utilizing an SH-type surface wave, comprising:

a piezoelectric substrate having two opposing edge surfaces; and first and second interdigital transducers each having a plurality of electrode fingers and being arranged on the piezoelectric substrate such that a shear horizontal surface wave excited by one of the first and second interdigital transducers is reflected between the two opposing edge surfaces to form a standing wave; wherein attenuation poles of frequency characteristics of the first and second interdigital transducers are adjacent to the frequency position of spurious responses determined by the distance between the two opposing edge surfaces; and a number of pairs of electrode fingers of the first interdigital transducer is different from a number of pairs of electrode fingers of the second interdigital transducer such that the attenuation poles of frequency characteristics of the first and second interdigital transducers are adjacent to the frequency position of spurious responses determined by the distance between the two opposing edge surfaces.

2. An edge reflection type longitudinally coupled surface acoustic wave filter according to claim 1, wherein a ratio of a number of pairs of electrode fingers of the first and second interdigital transducers is in a range of about 1.2:1.0 to about 1.7:1.0.

3. An edge reflection type longitudinally coupled surface acoustic wave filter according to claim 1, wherein a plurality of at least one of the first and second interdigital transducers are provided.

4. An edge reflection type longitudinally coupled surface acoustic wave filter according to claim 1, wherein the one of the first and second interdigital transducers having a larger number of pairs of electrode fingers is an input side or an output side, and the other of the first and second interdigital transducers having a relatively smaller number of pairs of electrode fingers is used for interstage connection.

5. An edge reflection type longitudinally coupled surface acoustic wave filter according to claim 1, wherein the substrate is made of at least one of $LiNbO_3$, $LiTaO_3$, a piezoelectric single crystal and a piezoelectric ceramic.

6. An edge reflection type longitudinally coupled surface acoustic wave filter according to claim 1, wherein the edge surfaces are substantially parallel to each other.

7. An edge reflection type longitudinally coupled surface acoustic wave filter according to claim 1, wherein the electrode fingers of the first and second interdigital electrodes are substantially parallel to the edge surfaces.

8. An edge reflection type longitudinally coupled surface acoustic wave filter according to claim 1, wherein an outermost one of the electrode fingers of one of the first and second interdigital electrodes is flush with one of the edge surfaces of the substrate.

9. An edge reflection type longitudinally coupled surface acoustic wave filter according to claim 1, wherein the number of electrode pairs of the first interdigital transducer is 30 and the number of electrode pairs of the second interdigital transducer is 23.

10. An edge reflection type longitudinally coupled surface acoustic wave filter utilizing an SH-type surface wave, comprising:

a piezoelectric substrate having two opposing edge surfaces; and first and second interdigital transducers each having a plurality of electrode fingers and being arranged on the piezoelectric substrate such that a shear horizontal surface wave excited by one of the first and second interdigital transducers is reflected between the two opposing edge surfaces to form a standing wave; wherein a ratio of a number of pairs of electrode fingers of the first and second interdigital transducers is in a range of about 1.2:1.0 to about 1.7:1.0.

11. An edge reflection type longitudinally coupled surface acoustic wave filter according to claim 10, wherein attenuation poles of frequency characteristics of the first and second interdigital transducers are adjacent to the frequency position of spurious responses determined by the distance between the two opposing edge surfaces.

12. An edge reflection type longitudinally coupled surface acoustic wave filter according to claim 10, wherein a plurality of at least one of the first and second interdigital transducers are provided.

13. An edge reflection type longitudinally coupled surface acoustic wave filter according to claim 10, wherein the one of the first and second interdigital transducers having a larger number of pairs of electrode fingers is an input side or an output side, and the other of the first and second interdigital transducers having a relatively smaller number of pairs of electrode fingers is used for interstage connection.

14. An edge reflection type longitudinally coupled surface acoustic wave filter according to claim 10, wherein the substrate is made of at least one of $LiNbO_3$, $LiTaO_3$, a piezoelectric single crystal and a piezoelectric ceramic.

15. An edge reflection type longitudinally coupled surface acoustic wave filter according to claim 10, wherein the edge surfaces are substantially parallel to each other.

16. An edge reflection type longitudinally coupled surface acoustic wave filter according to claim 10, wherein the electrode fingers of the first and second interdigital electrodes are substantially parallel to the edge surfaces.

17. An edge reflection type longitudinally coupled surface acoustic wave filter according to claim 10, wherein an outermost one of the electrode fingers of one of the first and second interdigital electrodes is flush with one of the edge surfaces of the substrate.

18. An edge reflection type longitudinally coupled surface acoustic wave filter according to claim 10, wherein the number of electrode pairs of the first interdigital transducer is 30 and the number of electrode pairs of the second interdigital transducer is 23.

* * * * *